United States Patent [19]

Shiomi et al.

[11] Patent Number: 5,013,936
[45] Date of Patent: May 7, 1991

[54] BICMOS LOGIC CIRCUIT USING COMPLEMENTARY BIPOLAR TRANSISTORS HAVING THEIR EMITTERS CONNECTED TOGETHER

[75] Inventors: Toru Shiomi; Kimio Ueda, both of Hyogo, Japan

[73] Assignee: Mitsubishi Denki Kabushiki Kaisha, Tokyo, Japan

[21] Appl. No.: 551,359

[22] Filed: Jul. 12, 1990

[30] Foreign Application Priority Data

Jan. 31, 1990 [JP] Japan .................................. 2-22932

[51] Int. Cl.$^5$ .......................................... H03K 19/02
[52] U.S. Cl. .................................... 307/446; 307/570
[58] Field of Search ...................... 307/446, 448, 296.7, 307/570

[56] References Cited

U.S. PATENT DOCUMENTS

| 4,103,188 | 7/1978 | Morton | 307/446 |
|---|---|---|---|
| 4,694,203 | 9/1987 | Uragami et al. | 307/448 |
| 4,810,903 | 3/1989 | Bushey et al. | 307/446 |
| 4,829,201 | 5/1989 | Masuda et al. | 307/446 |
| 4,890,018 | 12/1989 | Fukushi et al. | 307/446 |
| 4,906,868 | 3/1990 | Maki et al. | 307/446 |
| 4,965,470 | 10/1990 | Shin | 307/570 |

FOREIGN PATENT DOCUMENTS 54-148469 11/1979 Japan .
59-19435 1/1984 Japan .
60-125015 7/1985 Japan .

OTHER PUBLICATIONS

Bipolar Structures for BiMOS Technology, Esmat Z. Hamdy and Mohamed I. El Masry, IEEE Journal of Solid-State Circuits, vol. SC-15, No. 2. Apr. 1980.

Primary Examiner—David Hudspeth
Assistant Examiner—Scott A. Ouellette
Attorney, Agent, or Firm—Lowe, Price, LeBlanc, Becker & Shur

[57] ABSTRACT

A logic circuit includes an output pull up npn bipolar transistor (15; 28; 38), an output pull down pnp bipolar transistor (16; 29; 39), a first insulated gate type transistor (11, 12; 21, 22, 23, 24; 31, 32, 33, 34) for controlling the base potential of the output pull up bipolar transistor in response to an input signal, a second insulated gate type transistor (14; 25, 26, 27; 35, 36, 37) for controlling the base potential of the output pull down bipolar transistor in response to the input signal, and an impedance element (13; 18; 30; 40) for short-circuiting the base and the collector of the output pull down bipolar transistor. The impedance element is separated from the signal input terminal, and is formed by a resistance or an insulated gate type transistor operating in response to the base potential of the pull up transistor. The output pull up and pull down transistors both have collector grounded arrangement.

6 Claims, 8 Drawing Sheets

| INPUT 10 | PMoS 42 | NMoS 43 | PNP 45 | NPN 46 | OUTPUT 17 |
|---|---|---|---|---|---|
| "0" | ON | OFF | ON | OFF | "1" |
| "1" | OFF | ON | OFF | ON | "0" |

| INPUT 10 | PMoS 11 | NMoS 12 | NMoS 13 | NMoS 14 | NPN 15 | PNP 16 | OUTPUT 17 |
|---|---|---|---|---|---|---|---|
| "0" | ON | OFF | ON | OFF | ON | OFF | "1" |
| "1" | OFF | ON | OFF | ON | OFF | ON | "0" |

BICMOS LOGIC CIRCUIT USING COMPLEMENTARY BIPOLAR TRANSISTORS HAVING THEIR EMITTERS CONNECTED TOGETHER

BACKGROUND OF THE INVENTION

1. Field of the Invention

The present invention relates to a semiconductor logic operating circuit and, more specifically, to a structure of a BiCMOS logic integrated circuit incorporating a bipolar transistor, an n channel insulated gate type field effect transistor and a p channel insulated gate type field effect transistor.

2. Description of the Background Art

A BiCMOS circuit incorporating a bipolar transistor and a CMOS transistor has been widely used for realizing high speed operation and low power consumption, utilizing the high speed operation performance of the bipolar transistor and low power consumption performance of the CMOS transistor (Complimentary Insulated Gate Type Field Effect Transistor).

Figure 1:
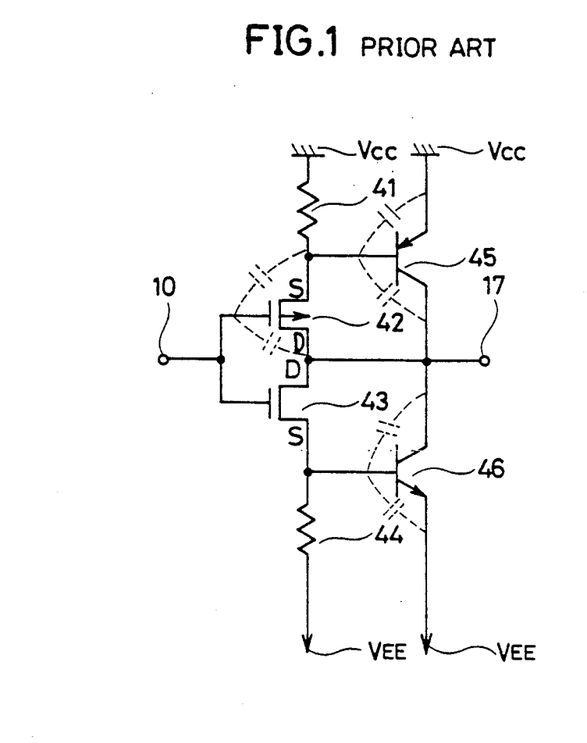
FIG. 1 shows one example of a structure of a conventional semiconductor logic circuit.

FIG. 1 shows a circuit arrangement of a conventional BiCMOS logic circuit shown in, for example, Japanese Patent Laying Open No. 59-19435. The logic circuit shown in FIG. 1 forms an inverter circuit.

Referring to FIG. 1, the conventional BiCMOS inverter circuit comprises a p channel insulated gate type field effect transistor (hereinafter referred to as a pMOS) 42 and an n channel insulated gate type field effect transistor (hereinafter referred to as an nMOS transistor) 43 for inverting an input signal applied to an input terminal 10, and a pnp bipolar transistor 45 and an npn bipolar transistor 46 for driving charging/discharging of an output terminal 17.

The pMOS transistor 42 has its source connected to a first supply potential Vcc through a resistance 41 and to a base of the pnp bipolar transistor 45, its drain connected to a collector of the pnp bipolar transistor 45 and to the output terminal 17, and its gate connected to the input terminal 10. The nMOS transistor 43 has its drain connected to the output terminal 17, a collector of the npn bipolar transistor 46 and to the drain of the pMOS transistor 42, its source connected to a second supply potential $V_{EE}$ through a resistance 44 and to a base of the npn bipolar transistor 46, and its gate connected to the input terminal 10.

The pnp bipolar transistor 45 has its emitter connected to the first supply potential Vcc, its collector connected to the output terminal 17, and its base connected to the first supply potential Vcc through the resistance 41. The npn bipolar transistor 46 has its collector connected to the output terminal 17, its emitter connected to the second supply potential $V_{EE}$, and its base connected to the second supply potential $V_{EE}$ through the resistance 44. The resistances 41 and 44 provide bias between the base and the emitter of the pnp bipolar transistor 45 and of the npn bipolar transistor 46, and supplies current to the bases of the transistors, respectively.

Figure 2:
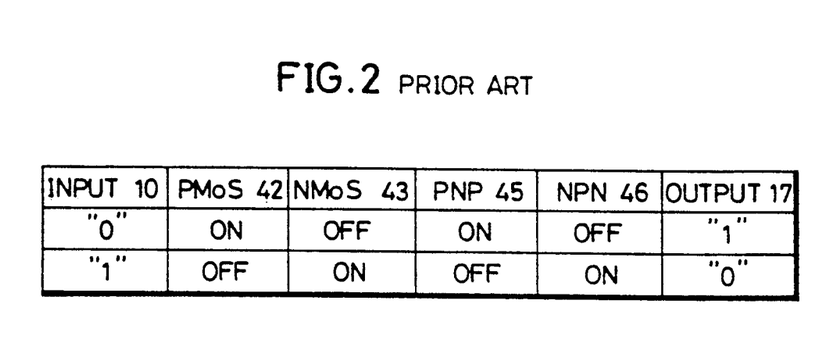
FIG. 2 shows, in a table, logic operation of the conventional semiconductor logic circuit shown in FIG. 1.

The operation will be described. FIG. 2 is a table showing ON/OFF states of the transistors and the input/output logic values of the circuit shown in FIG. 1. Now, let us assume that a logic value "0", that is, the potential level "L" is applied to the input terminal 10. In that case, the pMOS transistor 42 is turned on, while the nMOS transistor 43 is turned off. Since the pMOS transistor 42 is turned on, a current flows through the resistance 41 and through the transistor 42 to the output terminal 17. At this time, the base potential of the pnp bipolar transistor 45 falls from the first supply potential Vcc level, the base-emitter of the pnp bipolar transistor 45 is biased in the forward direction, and the pnp bipolar transistor 45 is turned on.

Meanwhile, since the nMOS transistor 43 is off, the base and the emitter of the npn bipolar transistor 46 are short circuited through the resistance 44, and since no base current is supplied thereto, it is turned off.

Consequently, the output terminal 17 is supplied with the current from the first supply potential Vcc through the pnp bipolar transistor 45 and the pMOS transistor 42. Generally, a bipolar transistor is capable of supplying large current. Therefore, the output terminal 17 is charged at high speed, and the potential thereof is increased. Finally, the potential level of the output terminal 17 reaches the first supply potential Vcc level, by the function of the resistance 41, that is, the function to operate the transistor 45 in a saturation region. Accordingly, when a signal having the logic value "0" is applied to the input terminal 10, a logic value "1" (potential level "H") is outputted at the output terminal 17.

When the logic value "1" is applied to the input terminal 10, the pMOS transistor 42 is turned off, and the nMOS transistor 43 is turned on. When the pMOS transistor 42 is turned off, the base and the emitter of the pnp bipolar transistor 40 are short circuited through the resistance 41, and since the base current is not supplied thereto, the pnp bipolar transistor 45 is turned off.

Since the nMOS transistor 43 is on, the collector-base of the npn bipolar transistor 46 is short circuited through the on resistance of the transistor 43, a current is supplied from the output terminal 17 to the base of the npn bipolar transistor 46, and the base-emitter thereof is biased in the forward direction by the resistance 44 to be turned on. Consequently, the potential at the output terminal 17 is discharged at high speed through the npn bipolar transistor 46, and the potential thereof falls. Finally, the potential level of the output terminal 17 reaches the level of the second supply potential $V_{EE}$ by the function of the resistance 44 to operate the transistor 46 in the saturation region. Accordingly, when the logic value "1" is applied to the input terminal 10, the logic value "0" is transmitted to the output terminal.

Generally, a bipolar transistor has parasitic capacitances between the base and the emitter and between the base and the collector derived from junction capacitances, interconnection capacitances or the like, as shown by the dotted line in FIG. 1. Similarly, MOS transistor has the parasitic capacitances between the gate and the source and between the gate and the drain thereof. Therefore, when the potential level of the output terminal 17 changes from "1" ("H") to "0" ("L"), the output terminal 17 and the base of the pnp bipolar transistor 45 is capacitance-coupled through the parasitic capacitance, so that a current flows through a path formed of the resistance 41-parasitic capacitance-the output terminal 17 or the first supply potential Vcc-parasitic capacitance-output terminal 17, for example, and as a result, a base current flows to the pnp bipolar transistor 45. Since the npn bipolar transistor 46 has been changed to the on state at this time, there exists a period in which the pnp bipolar transistor 45 and the npn bipolar transistor 46 are both on, a through current flows from the first supply potential Vcc to the second supply potential $V_{EE}$ and the power consumption is increased. The problem of the through current is of great significance especially when the logic circuit is operated at high speed.

In order to avoid this problem, the resistance value of the resistance 41 may be decreased to reduce the base current of the transistor 45. When the potential level of the output terminal 17 changes from "0" to "1", it is necessary to turn the transistor 45 sufficiently into the on state by lowering the base potential of the pnp bipolar transistor 45 sufficiently and by supplying a large base current. However, as the resistance value of the resistance 41 is made smaller, the base potential is set high even if the pMOS transistor 42 is on. Consequently, the pnp bipolar transistor 45 is not sufficiently turned on and the base current thereof becomes smaller, so that the ability of supplying current thereof is decreased, the output terminal 17 can not be charged at high speed, and the high speed operation becomes impossible.

If the resistance value of the resistance 41 is made larger, the base current of the pnp bipolar transistor 45 is increased, so that the current handling capability of the transistor 45 may be improved. However, there arises a problem of a large through current. Accordingly, it is necessary to set the value of the resistance 41 at an appropriate value in order to reduce the through current while maintaining the capability of driving of the pnp bipolar transistor 45, which is a difficult task. Especially when the manufacturing parameters of respective elements are different in different devices, it is impossible to set the resistance value of the resistance 41 at an appropriate value common to all the devices, and therefore a highly reliable semiconductor logic circuit can not be provided.

In addition, since the carriers in the pnp bipolar transistor are holes, the operational characteristics (speed of operation, capability of supplying current) thereof are in general inferior to those of the npn bipolar transistors in which the carriers are electrons. Therefore, in the circuit structure shown in FIG. 1 in which the pnp bipolar transistor 45 is used for an element for pulling up the output terminal, the rising characteristic of the voltage at the output terminal 17 is degraded.

Even if the gate width of the pMOS transistor 42 is enlarged to increase the conductance of the transistor 42 so as to compensate for the current supplying capability of the pnp bipolar transistor 45 by the utilization of the current supplying capability of the pMOS transistor 42 in order to improve the voltage rising characteristic at the output terminal, the ratio of the sizes of the pMOS transistor 42 and the nMOS transistor 43 at the input portion (ratio of the gate width, or the ratio of the gate width/gate length) is different, and therefore the input logic threshold value of the logic circuit becomes different.

In addition, since the potential of the output terminal 17 is made fully swung between the first supply potential Vcc and the second supply potential $V_{EE}$ by using the resistances 41 and 44 and emitter grounded output driving transistor 45 and 46, it takes a long time until the potential of the output terminal 17 is established, which reduces the speed of operation of the logic circuit.

Japanese Patent Laying Open No. 54-14869 discloses an inverter circuit comprising collector grounded npn bipolar transistor and pnp bipolar transistor for driving the output and an CMOS inverter for driving these bipolar transistors in response to an input signal. The speed of operation of this circuit is not very high, since the output voltage thereof is fully swung between $+V$ and $-V$.

Japanese Patent Laying Open No. 60-125015 discloses a BiCMOS inverter comprising totem-pole connected npn bipolar transistors for driving the output and MOS transistors for drawing out electric charges of the bases of these bipolar transistors in response to an input signal.

SUMMARY OF THE INVENTION

An object of the present invention is to provide an improved semiconductor logic circuit eliminating the above described drawbacks of the conventional semiconductor logic circuit.

Another object of the present invention is to provide a semiconductor logic circuit having both advantages of high speed operation and low power consumption.

A further object of the present invention is to provide a semiconductor logic circuit in which parameters of elements can be set readily.

A still further object of the present invention is to provide a semiconductor logic circuit having the same outputting characteristic as the falling characteristic.

A still further object of the present invention is to provide a semiconductor logic circuit which occupies smaller area.

The semiconductor logic circuit in accordance with the present invention comprises a first insulated gate type field effect transistor for controlling base potential of a bipolar transistor for pulling up an output in response to an input signal, a second insulated gate type field effect transistor controlling base potential of a bipolar transistor for pulling down the output in response to the input signal, and impedance means isolated from a signal input terminal and for short-circuiting the collector and the base of the bipolar transistor for pulling down the output.

More specifically, the semiconductor logic circuit in accordance with the present invention comprises: a first bipolar transistor having a collector of a first conductivity type connected to a first reference potential, an emitter of the first conductivity type connected to an output terminal and a base of a second conductivity type; a second bipolar transistor having a collector of the second conductivity type connected to a second reference potential, an emitter of the second conductivity type connected to the output terminal and a base of the first conductivity type; at least one insulated gate type field effect transistor of the second conductivity type provided between the base of the first bipolar transistor and the first reference potential for selectively coupling the base of the first transistor and the first reference potential in response to an input signal; at least one insulated gate type field effect transistor of the first conductivity type provided between the first transistor and the second reference potential for selectively coupling the base of the first transistor and the second reference potential in response to the input signal; an insulated gate type field effect transistor of the first conductivity type provided between the base of the second bipolar transistor and the second reference potential for selectively coupling the base of the second bipolar transistor and the second reference potential in response to the input signal; and impedance means isolated from an input terminal for coupling the second bipolar transistor with the output terminal.

The impedance means is formed of an insulated gate type field effect transistor of the first conductivity type which operates as a switch in response to the base potential of the first bipolar transistor. Alternatively, the impedance means is formed of a fixed resistance.

One of the above mentioned at least one insulated gate type field effect transistor of the first conductivity type and the above mentioned at least one insulated gate type transistor of the second conductivity type provides parallel connection arrangement, and the other provides series connection arrangement.

Preferably, the semiconductor logic circuit further comprises resistance means arranged between the base and the emitter of the first bipolar transistor.

Since the control of the base potential of the first bipolar transistor and of the base potential of the second bipolar transistor is done by an insulated gate type field effect transistor operating as a switch in response to an input signal, charging and discharging of the bases of the first and second bipolar transistors can be carried out at high speed, whereby the on-off operation of the first and second bipolar transistors can be done at high speed. Consequently, the first and second bipolar transistors can be prevented from being on simultaneously, which prevents generation of the through current and realizes high speed logic operation.

By adjusting gate width of the insulated gate type field effect transistor of the first conductivity type for driving the base of the second bipolar transistor, the speed of drawing out of the base current of the second bipolar transistor can be adjusted, whereby the rising characteristic and the falling characteristic can be made the same without changing the input logic threshold value.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figures 3, 4:
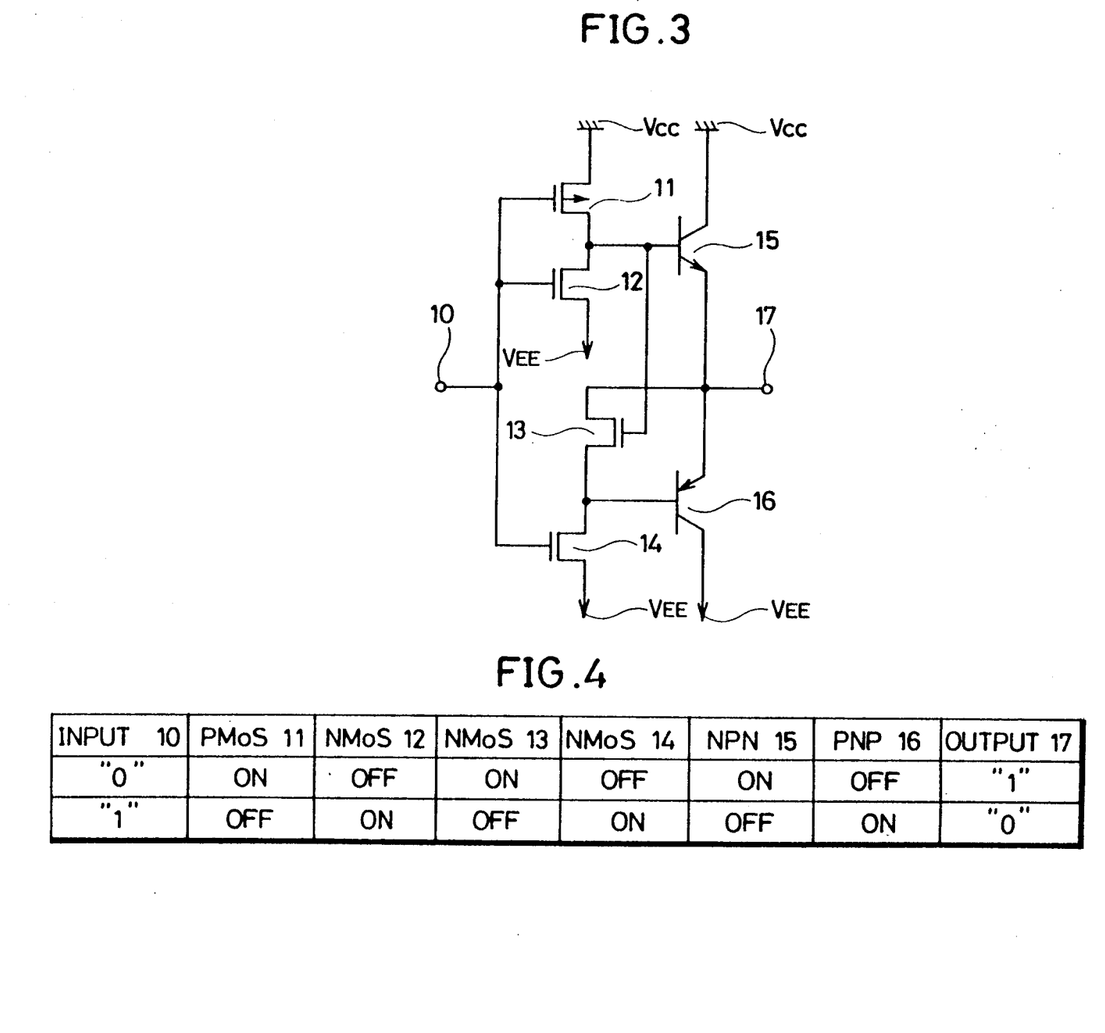
FIG. 3 shows a structure of a semiconductor logic circuit in accordance with a first embodiment of the present invention.
FIG. 4 shows, in a table, logic operations of the circuit shown in FIG. 3.

FIG. 3 shows a structure of a semiconductor logic circuit in accordance with a first embodiment of the present invention. Referring to FIG. 3, the semiconductor logic circuit comprises an npn bipolar transistor 15 for pulling up potential of an output terminal 17, and a pnp bipolar transistor 16 for pulling down the potential of the output terminal 17. The npn bipolar transistor 15 has its collector connected to a first reference potential $V_{cc}$ and its emitter connected to the output terminal 17. The pnp bipolar transistor 16 has its emitter connected to the output terminal 17 and its collector connected to a second reference potential $V_{EE}$.

The semiconductor logic circuit further comprises a pMOS transistor 11 and nMOS transistor 12 for driving the base of the npn bipolar transistor 15 in response to an input signal applied to an input terminal 10, and an nMOS transistor 14 for driving the base of the pnp bipolar transistor 16 in response to an input signal applied to the input terminal 10. The pMOS transistor 11 has its source connected to the first reference potential $V_{cc}$, its gate connected to the input terminal 10 and its drain connected to the base of the npn bipolar transistor 15 and to the drain of the nMOS transistor 12.

The nMOS transistor 12 has its source connected to the second reference potential $V_{EE}$, its drain connected to the drain of the pMOS transistor 11 and to the base of the npn bipolar transistor 15, and its gate connected to the input terminal 10.

The nMOS transistor 14 has its source connected to the second reference potential $V_{EE}$, its drain connected to the base of the pnp bipolar transistor 16 and its gate connected to the input terminal 10.

The semiconductor logic circuit further comprises an nMOS transistor 13 having its gate connected to the pMOS transistor 11, its drain connected to the output terminal 17 and its source connected to the base of the pnp bipolar transistor 16 and to the drain of the nMOS transistor 14. The operation will be described in the following.

FIG. 4 shows, in a table, the logic operations and the states of the transistors in the semiconductor logic circuit of FIG. 3. Let us assume that the logic value "0" ("L") is applied to the input terminal 10. In the following description, the logic value "0" corresponds to the potential "L" level, and the logic value "1" corresponds to the potential "H" level. When a signal "0" is applied to the input terminal, the pMOS transistor 11 is turned on, and nMOS transistors 12 and 14 are turned off. Consequently, the first reference potential $V_{cc}$ is transmitted to the gate of the nMOS transistor 13, so that the nMOS transistor 13 is turned on and a base current is supplied to the base of the npn bipolar transistor 15.

When the nMOS transistor 13 is turned on, the pnp bipolar transistor 16 is turned off with the emitter-base thereof being short-circuited. Approximately at the same time, the npn bipolar transistor 15 is turned on by the application of the base current. Consequently, the output terminal 17 receives a large current through the npn bipolar transistor 15 and the potential thereof rises to "1" at high speed.

The operation when a signal "1" is applied to the input terminal 10 will be described. In that case, the pMOS transistor 11 is turned off and nMOS transistors 12 and 14 are turned on. Consequently, the gate potential of the nMOS transistor 13, the base potential of the npn bipolar transistor 15 and the base potential of the pnp bipolar transistor 16 all fall to the second reference potential $V_{EE}$. Consequently, the nMOS transistor 13 and the npn bipolar transistor 15 are both turned off, while the pnp bipolar transistor 16 is turned on. The potential of the output terminal 17 is discharged at high speed through the pnp bipolar transistor 16, and the potential level thereof attains to "0".

Generally, the carriers in the pnp bipolar transistor are holes, and therefore, characteristics such as speed of operation of the pnp bipolar transistor is inferior to those of the npn bipolar transistors in which carriers are electrons. Therefore, in such a conventional circuit structure as shown in FIG. 1 in which the base of an emitter grounded pnp bipolar transistor for pulling up the output is connected to the first reference potential Vcc through a fixed resistance, although the attainable potential of the output terminal can be the first and second reference potentials Vcc and $V_{EE}$ by the emitter grounded output driving transistor as shown by dotted line (1) and (2) in the waveforms FIG. 5, the output rising characteristic of the logic circuit is inferior to the falling characteristic, since the rising characteristic of the logic circuit output is determined by the switching characteristic of the pnp bipolar transistor.

In the structure of the present invention, when the gate width of the nMOS transistor 14 (or the transistor size) is adjusted to increase current handling capability thereof, drawing out of base current of the pnp bipolar transistor 16 at high speed becomes possible. Consequently, the pnp bipolar transistor 16 can be changed to the on state at high speed, which speed is approximately the same as the speed of change of the npn bipolar transistor 15 to the on state, whereby the rising characteristic and the falling characteristic can be made the same as shown by the curves (3) and (4) of FIG. 5.

Since drawing out of the base currents of the npn bipolar transistor 15 and of the pnp bipolar transistor 16 is done by the nMOS transistors 12 and 14, respectively, the change of the npn bipolar transistor 15 from the on state to the off state, and the change of the pnp bipolar transistor 16 from the off state to the on state can be carried out at high speed. Meanwhile, since the nMOS transistor 12 is perfectly off when the input signal is "0", the base current can be effectively supplied to the npn bipolar transistor 15 through the pMOS transistor 11, whereby the npn bipolar transistor 15 can be changed to the on state at high speed. At this time, the pnp bipolar transistor 16 is also changed to the off state as the emitter-base thereof is short-circuited by the nMOS transistor 13 at high speed.

Namely, the on-off operation of the npn bipolar transistor 15 and of the pnp bipolar transistor 16 can be carried out at higher speed, and the time period in which the transistors 15 and 16 are both on can be reduced to approximately 0 sec, which prevents generation of the through current and decreases power consumption.

The npn bipolar transistor 15 has its base and its emitter not connected, and the pnp bipolar transistor 16 has its base and its emitter coupled through the nMOS transistor 13. Namely, the npn bipolar transistor 15 has a diode connection arrangement when it is on, and accordingly, the highest potential reached at the output terminal 17 is $V_{CC}-V_{CEsat}$. $V_{CEsat}$ is a collector-emitter saturation voltage of the npn bipolar transistor 15.

Since the base of the pnp bipolar transistor 16 is connected to the second reference potential $V_{EE}$ through the nMOS transistor 14, the transistor 16 also has the diode connection arrangement when it is on. Therefore, the lowest potential reached of the output terminal 17 becomes $V_{EE}+V_{CEsat}$. $V_{CEsat}$ is a collector-emitter saturation voltage of the bipolar transistor 16, which is the same as that of the npn bipolar transistor 15. Namely, the width of logical swing at the output terminal 17 can be made smaller than that in the conventional circuit structure, which reduces time necessary for the potential of the output terminal 17 to be established, and accordingly the speed of operation of the logic circuit can be increased.

Figure 5:
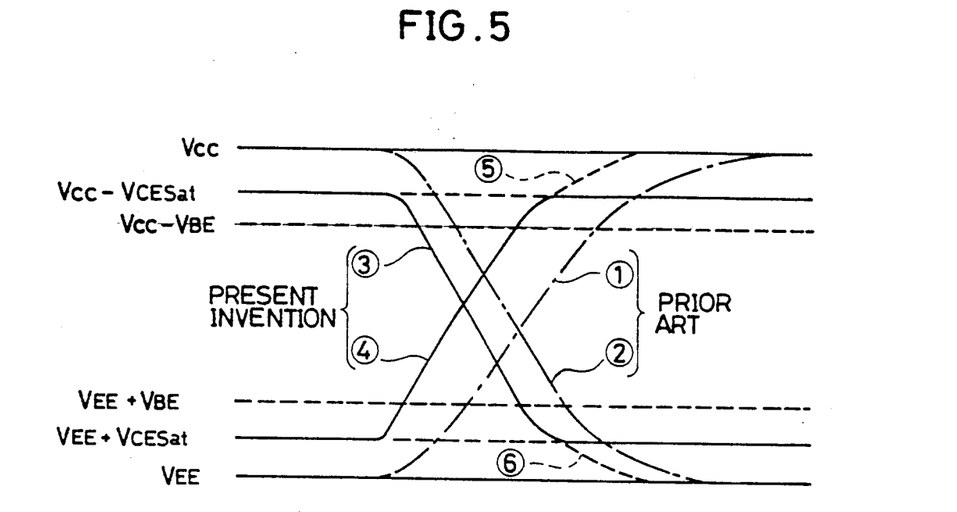
FIG. 5 shows operational characteristics of the semiconductor logic circuit of the present invention and of the conventional semiconductor logic circuit.

In FIG. 5, the reference character $V_{BE}$ represents the base-emitter voltage of the transistors 15 and 16, and in the range of voltages $V_{CC}-V_{BE}$ to $V_{EE}+V_{BE}$, the charging/discharging operation at the output terminal 17 is carried out at high speed.

The npn bipolar transistor 15 and the pnp bipolar transistor 16 are both collector grounded, and therefore the collector of the npn bipolar transistor 15 can be fixed at the first reference potential Vcc and the collector of the pnp bipolar transistor 16 can be fixed at the second reference potential $V_{EE}$. Therefore, it becomes possible to form the npn bipolar transistor 15 and the pMOS transistor 11 in the same n-well region and to form the pnp bipolar transistor 16 and the nMOS transistor (for example, 13, 14) in the same p-well as shown as an example in FIG. 6, whereby the layout area of the logic circuit on the semiconductor chip can be reduced.

Generally, in the MOS transistor, a constant bias voltage must be supplied to the substrate region in order to prevent fluctuation of the threshold voltage and to reduce parasitic capacitances therewith. For this purpose, in laying-out of BiCMOS circuit, the bipolar transistor forming regions and the MOS transistor forming regions are provided on separate semiconductor regions, and these regions are electrically separated by an isolation region.

However, as in the present invention, if the pnp bipolar transistor and the npn bipolar transistor are both collector grounded, these collector regions can be used as the substrate region of the MOS transistor, a bipolar transistor and a MOS transistor can be formed in the same well, and accordingly, the layout area of the circuit can be reduced. The structure of the BiCMOS circuit will be described with reference to FIG. 6.

Figure 6:
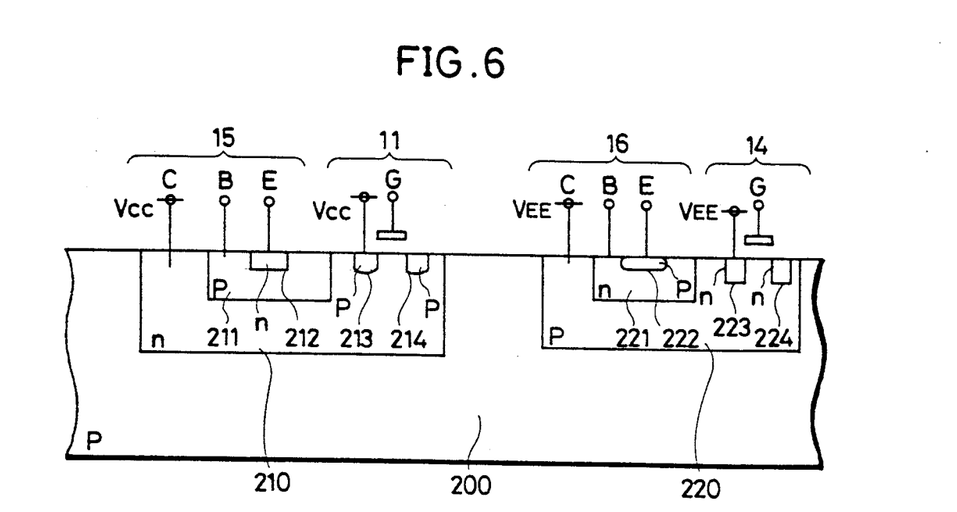
FIG. 6 shows cross sectional structure of the semiconductor logic circuit in accordance with the present invention.

Referring to FIG. 6, an n-well 210 and a p-well 220 are formed on a p type semiconductor substrate 200.

A p-well region 211 is further formed on the surface of the n-well 210, and an n type impurity implanted region 212 is formed at the surface region of the p-well region 211. In the n-well 210, p type impurity implanted layers 213 and 214 are formed in regions different from the p-well 211. The n-well region 210 forms the npn bipolar transistor 15 and a substrate region of the pMOS transistor 11, for example. The p-well region 211 forms the base region of the npn bipolar transistor, and the n type impurity region 212 forms the emitter region of the npn bipolar transistor 15.

The p type impurity region 213 forms the drain region of the pMOS transistor 11, and the p type impurity region 214 forms the source region of the pMOS transistor 11. Therefore, the n-well region 210 is fixed at the first reference potential Vcc, so that the substrate of the pMOS transistor 11 can be biased to the reference potential Vcc. Consequently, the npn bipolar transistor and the pMOS transistor can be formed in the same n-well region 210.

In the p-well 220, an n-well 221 is formed on the surface thereof, and a p type impurity region 222 is formed at the surface of the n-well 221. In addition, in the p-well 220, n type impurity regions 223 and 224 are formed in regions different from the n-well 221. The p-well 220 provides the collector region of the pnp bipolar transistor 16, for example, the n-well 221 provides the base region of the pnp bipolar transistor 16, and the p type impurity region 222 provides the emitter region of the pnp bipolar transistor 16.

The n type impurity region 223 provides the source region of the nMOS transistor 14, and the n type impurity region 224 provides the drain region of the nMOS transistor 14. Therefore, the p-well 220 is common to the collector region of the pnp bipolar transistor 16 and the substrate region of the n-MOS transistor 14, and accordingly, the bipolar transistor and the nMOS transistor can be formed in the same p-well region.

Although not specifically shown, electrode taking-out layers formed of impurity diffused regions of high concentration are formed on the surface regions of the n-well 210 and of the p-well 220 forming the collector region, respectively, and they are connected to the reference potentials Vcc and $V_{EE}$ through the electrode taking-out regions, respectively.

In practical use, an isolating region is formed between the bipolar transistor and the nMOS transistor formed in the same well. FIG. 6 merely shows the idea of forming the bipolar transistor and the MOS transistor in the same well region, and the specific structure may be variously changed and modified.

Formation of these well regions and the impurity regions can be carried out in accordance with conventional impurity implanting method.

Therefore, as shown in FIG. 3, by using a collector grounded bipolar transistor as a transistor for driving output, a bipolar transistor and a MOS transistor can be formed in the same well, significantly reducing the area of layout of the circuit on the semiconductor chip.

Figure 7:
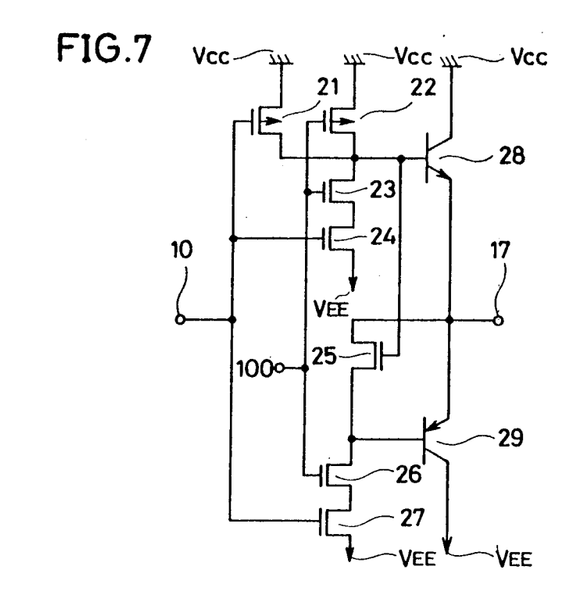
FIG. 7 shows a structure of a semiconductor logic circuit in accordance with a second embodiment of the present invention.

FIG. 7 shows a structure of a semiconductor logic circuit in accordance with a second embodiment of the present invention. The logic circuit shown in FIG. 7 forms a 2-input and 1-output NAND gate.

Referring to FIG. 7, the logic circuit comprises an npn bipolar transistor 28 and a pnp bipolar transistor 29 for driving the output. The npn bipolar transistor 28 has its collector connected to a first reference potential Vcc and its emitter connected to an output terminal 17. The pnp bipolar transistor 29 has its emitter connected to the output terminal 17 and its collector connected to a second reference potential $V_{EE}$.

In order to drive the npn bipolar transistor 28 in response to an input signal, pMOS transistors 21 and 22 and nMOS transistors 23 and 24 are provided. The pMOS transistor 21 has its source connected to the first reference potential Vcc, its drain connected to the base of the npn bipolar transistor 28 and its gate connected to a first input terminal 10. The pMOS transistor 22 has its source connected to the first reference potential Vcc, its drain connected to the base of the npn bipolar transistor 28, and its gate connected to a second input terminal 100. The nMOS transistor 23 has its drain connected to the base of the npn transistor 28, its gate connected to the second input terminal 100 and its source connected to the drain of the nMOS transistor 24. The nMOS transistor 24 has its gate connected to the first input terminal 10 and its source connected to the second reference potential $V_{EE}$.

Figure 8:
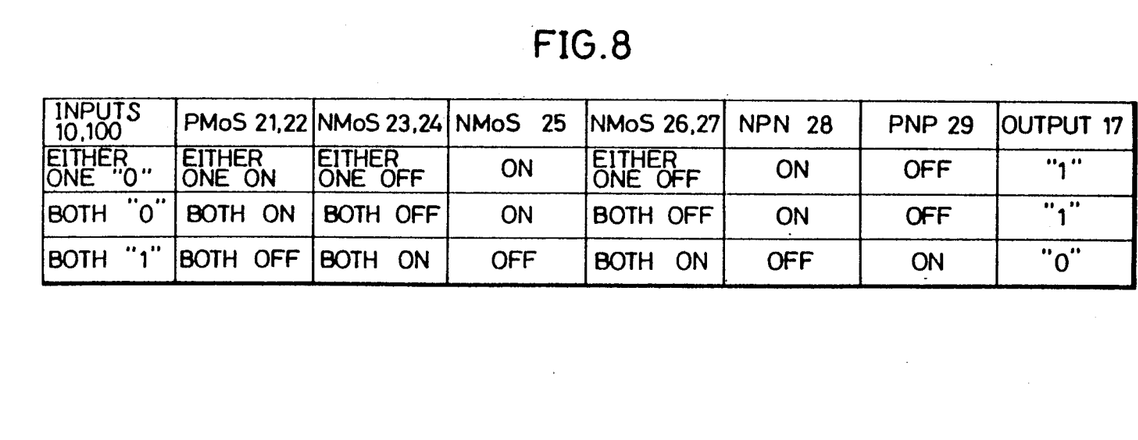
FIG. 8 shows, in a table, logic operations of the logic circuit shown in FIG. 7.

In order to drive the pnp bipolar transistor 29 in response to an input signal, nMOS transistors 26 and 27 are provided. The nMOS transistor 26 has its drain connected to the base of the pnp bipolar transistor 29, its gate connected to the second input terminal 100 and its source connected to the drain of the nMOS transistor 27. The nMOS transistor 27 has its gate connected to the first input terminal 10 and its source connected to the second reference potential $V_{EE}$. The logic circuit further comprises an nMOS transistor 25 having its gate connected to the base of the npn bipolar transistor 28, its drain connected to the output terminal 17 and its source connected to the base of the pnp bipolar transistor 29. The operation will be described in the following. FIG. 8 shows, in a table, the logic operations and states of the transistors in the logic circuit of FIG. 7. Let us assume that a signal "0" is applied to the input terminal 10 or 100. In this case, either the pMOS transistor 21 or 22 is turned on, either the nMOS transistor 23 or 24 is turned off, and either the nMOS transistor 26 or 27 is turned off. A base current is supplied to the base of the npn bipolar transistor 28 through a pMOS transistor (21 or 22) which is on and the base potential thereat increases. The npn bipolar transistor 28 is changed to the on state, and the nMOS transistor 25 is turned on. On this occasion, either the nMOS transistor 26 or 27 is off, and the emitter-base of the pnp bipolar transistor 29 is short-circuited by the nMOS transistor 25, so that the pnp bipolar transistor 29 is turned off. Consequently, the output terminal 17 is charged at high speed through the npn bipolar transistor, and its potential rises to "1".

When a signal "0" is applied to the input terminals 10 and 100, the pMOS transistors 21 and 22 are both turned on, and nMOS transistors 23, 24, 26 and 27 are turned off. Consequently, the nMOS transistor 25 is turned on as the gate potential thereof rises through the pMOS transistors 21 and 22, and the emitter-base of the pnp bipolar transistor 29 is short-circuited. At the same time, the base potential of the npn bipolar transistor 28 rises and the base current is supplied through the pMOS transistors 21 and 22, so that the npn bipolar transistor 28 is turned on. Consequently, the output terminal 17 is charged at high speed by the emitter current from the npn bipolar transistor 28, and its potential attains to "1".

When a signal "1" is applied to the input terminals 10 and 100, the pMOS transistors 21 and 22 are turned off and the nMOS transistors 23, 24, 26 and 27 are turned on. On this occasion, the base of the npn bipolar transistor 28 is discharged at high speed through the nMOS transistors 23 and 24, and the npn bipolar transistor 28 is turned off. Correspondingly, the nMOS transistor 25 is turned off. Meanwhile, the base of the pnp bipolar transistor 29 is discharged at high speed through the nMOS transistors 26 and 27, and its potential falls to the level of the second reference potential $V_{EE}$. Consequently, the pnp bipolar transistor 29 is turned on to discharge the output terminal 17 at high speed. Consequently, the output terminal 17 attains to the "0" level.

Although the illustrated logic circuit is a 2-input and 1-output NAND circuit, an NAND circuit having multi inputs and 1-output such as 3-input NAND gate, 4-input NAND gate may be formed by increasing the numbers of the pMOS transistors and the nMOS transistors 23, 24, 26 and 27.

Figure 9:
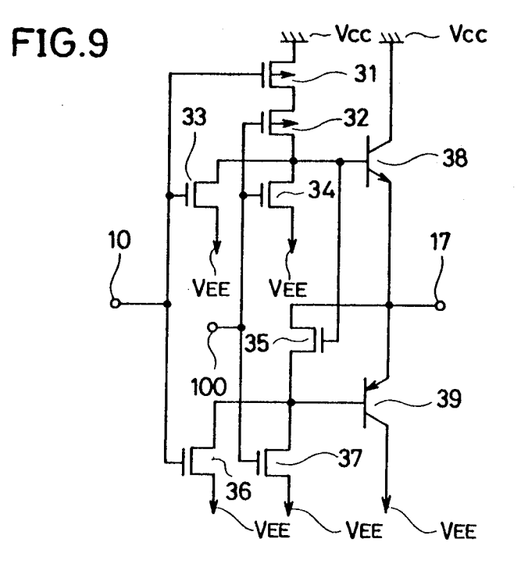
FIG. 9 shows a structure of a semiconductor logic circuit in accordance with a third embodiment of the present invention.

FIG. 9 shows a structure of a semiconductor logic circuit in accordance with a third embodiment of the present invention. The logic circuit shown in FIG. 9 is a 2-input·1-output NOR circuit. Referring to FIG. 9, the logic circuit (2-input NOR circuit) comprises an npn bipolar transistor 38 and a pnp bipolar transistor 39 for driving the output. pMOS transistors 31 and 32 are connected in series between the base of the npn bipolar transistor 38 and a first reference potential Vcc, and nMOS transistors 33 and 34 are provided between the base and the second reference potential $V_{EE}$. The pMOS transistor 31 has its gate connected to a first input terminal 10, its source connected to the first reference potential Vcc and its drain connected to the source of the pMOS transistor 32. The pMOS transistor 32 has its gate connected to a second input terminal 100, and its drain connected to the base of the npn bipolar transistor 38. The nMOS transistor 33 has its gate connected to the first input terminal 10, its drain connected to the base of the transistor 38 and its source connected to the second reference potential $V_{EE}$. The nMOS transistor 34 has its drain connected to the base of the transistor 38, its source connected to the second reference potential $V_{EE}$ and its gate connected to the second input terminal 100.

In order to drive the pnp bipolar transistor 39, nMOS transistors 35, 36 and 37 are provided. The nMOS transistor 35 has its drain connected to the output terminal 17, its source connected to the base of the pnp bipolar transistor 39 and its gate connected to the base of the npn bipolar transistor 38. The nMOS transistor 36 has its drain connected to the base of the transistor 39, its gate connected to the first input terminal 10 and its source connected to the second reference potential $V_{EE}$. The nMOS transistor 37 has its drain connected to the base of the transistor 39, its gate connected to the second input terminal 100 and its source connected to the second reference potential $V_{EE}$. The operation will be described.

Figure 10:
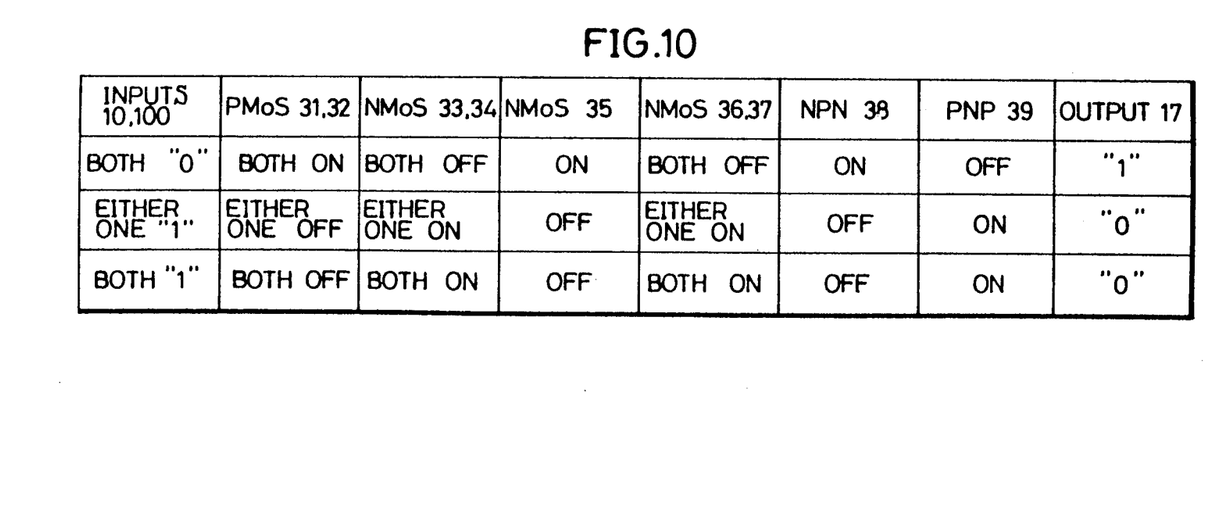
FIG. 10 shows, in a table, logic operations of the logic circuit shown in FIG. 9.

FIG. 10 shows, in a table, the states of the input/output terminals and the transistors at the logic operation of the circuit shown in FIG. 9. First, description will be given of a case in which a signal "0" is applied to the input terminals 10 and 100. In that case, pMOS transistors 31 and 32 are both turned on and the nMOS transistors 33, 34, 36 and 37 are turned off. Consequently, the gate potential of the nMOS transistor 35 increases to turn it on, and the npn bipolar transistor 38 is turned on with the base potential thereof risen to the level of the first reference potential Vcc. The base-emitter of the pnp bipolar transistor 39 is short-circuited by the nMOS transistor 35, and the transistor 39 is turned off. Consequently, the output terminal is charged at high speed by the emitter current from the npn bipolar transistor 38, and its potential level attains to "1".

The operation when a signal "1" is applied to the input terminal 10 or 100 will be described. In that case, either the pMOS transistor 31 or 32 is turned off, either the nMOS transistor 33 or 34 is turned on, and either the nMOS transistor 36 or 37 is turned on. Consequently, the nMOS transistor 35 is turned off with the base potential fallen to the level of the second reference potential $V_{EE}$. At the same time, the npn bipolar transistor 38 is turned off at high speed as the base potential thereof falls to the level of the second reference potential $V_{EE}$. Meanwhile, the base potential of the pnp bipolar transistor 39 falls at high speed to the level of the second reference potential $V_{EE}$ through the nMOS transistor (36 or 37) which is on. Consequently, the pnp bipolar transistor 39 is turned on to discharge at high speed the output terminal 17. Consequently, the potential level of the output terminal 17 attains to "0".

When the signal "1" is applied to both input terminals 10 and 100, the pMOS transistors 31 and 32 are both turned off, and the nMOS transistors 33, 34, 36 and 37 are all turned on. Therefore, the npn bipolar transistor 38 is turned off as the base potential thereof falls to the level of the second reference potential $V_{EE}$. Similarly, at this time, the nMOS transistor 35 is turned off as the gate potential thereof attains to the level of the second reference potential $V_{EE}$. The pnp bipolar transistor 39 falls to the level of the second reference potential $V_{EE}$ through the nMOS transistors 36 and 37, so that the transistor is turned on to discharge the output terminal 17 at high speed. Consequently, the level of the output terminal 17 attains to "0".

In the structure shown in FIG. 9, the same effect as that of the circuit shown in FIG. 3 can be obtained, since the bases of the transistors 38 and 39 for driving the output are driven by the nMOS transistor.

Although a 2-input 1-output NOR gate is shown in the structure of FIG. 9, a multi input 1-output NOR gate circuit such as a 3-input 1-output NOR gate, a 4-input 1-output NOR gate may be provided by expanding the structure of FIG. 9.

In the structures of the logic circuits shown in FIGS. 3, 7 and 9, the bipolar transistor for driving the output has its collector-to-emitter short-circuited through a MOS transistor. In this case, the bipolar transistor comes to be diode connected, and produces a voltage drop corresponding to the collector-emitter saturation voltage between the collector and the emitter thereof. Consequently, the output logic level does not become the full level of the reference potentials Vcc and $V_{EE}$.

A structure for setting the output logic level at the full level of the reference potential Vcc and $V_{EE}$ will be described.

Figure 11:
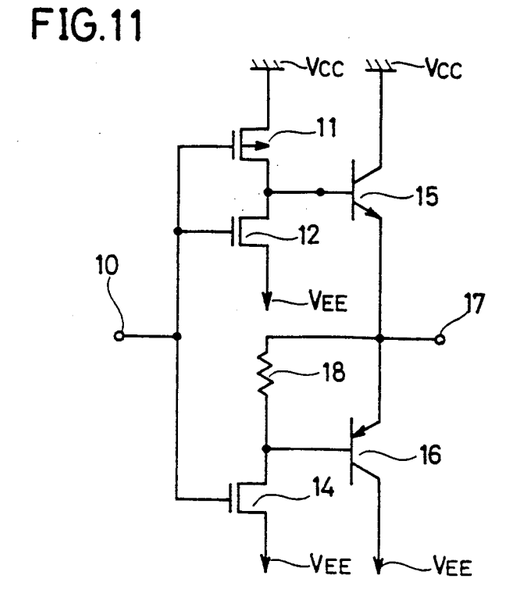
FIG. 11 shows a structure of a semiconductor logic circuit in accordance with a fourth embodiment of the present invention.

FIG. 11 shows a structure of a logic circuit in accordance with a fourth embodiment of the present invention. The logic circuit shown in FIG. 11 is a modification of the logic circuit shown in FIG. 3, in which a fixed resistance 18 is provided between the emitter and the base of the pnp bipolar transistor 16, instead of the nMOS transistor 13 of FIG. 3. In the circuit structure shown in FIG. 11, the pnp bipolar transistor 16 has its base-emitter connected through the fixed resistance 18, whereby the base-emitter of the pnp bipolar transistor 16 is constantly biased, and the base thereof is set to the second reference potential. Consequently, the level of the output logic "0" of the output terminal 17 can be lowered to the second reference potential $V_{EE}$ In this case, an input transistor of the succeeding stage can be surely turned off, enabling reduction of the through current in the input circuit of the succeeding stage.

Figure 12:
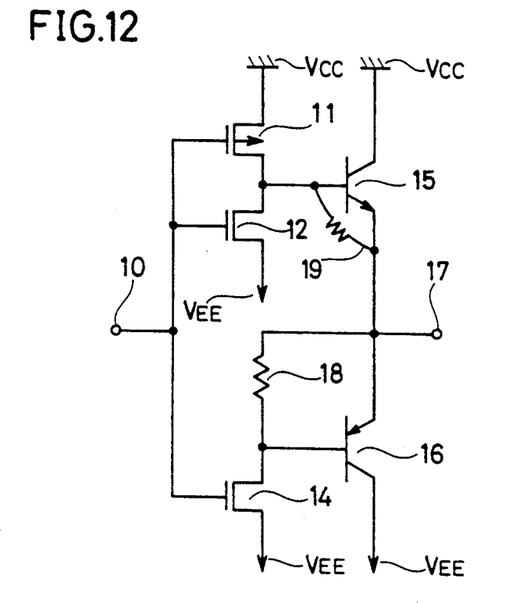
FIG. 12 shows a structure of a semiconductor logic circuit in accordance with a fifth embodiment of the present invention.

FIG. 12 shows a structure of a logic circuit in accordance with a fifth embodiment of the present invention. The logic circuit shown in FIG. 12 is a modification of the logic circuit shown in FIG. 11 in which a fixed resistance 19 is further provided between the base-emitter of the npn bipolar transistor 15 in the circuit structure shown in FIG. 11. In this structure, the npn bipolar transistor 15 for pulling up the output has its base-to-emitter connected through the resistance 19.

When the npn bipolar transistor 15 is on, the emitter and the base of the transistor 15 are connected through the resistance 19, and the base of the transistor 15 attains to the first reference potential Vcc, and accordingly, the transistor 15 can transmit the voltage of the Vcc level and the potential level of the output terminal 17 can be increased to the level of the first reference potential Vcc.

Similarly, in the pnp bipolar transistor 16, the emitter potential thereof can be fed back to the base of the transistor 16 through the resistance 18, so that the potential level of the logic "0" at the output terminal 17 can be lowered to the level of the second reference potential $V_{EE}$.

By this structure, the turning on-off of the transistor in an input circuit of the succeeding stage can be surely carried out, and the through current at the input portion of the succeeding circuit can be further reduced. The operation of the circuit shown in FIG. 12 is represented by the curves (5) and (6) in the diagram of waveforms of FIG. 5.

Figure 13:
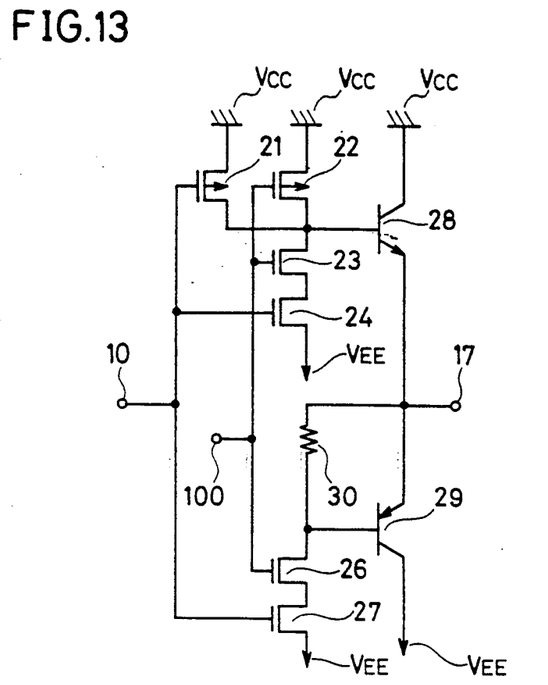
FIG. 13 shows a structure of a semiconductor logic circuit in accordance with a sixth embodiment of the present invention.

FIG. 13 shows a sixth embodiment of the present invention which is a modification of the circuit shown in FIG. 7. The circuit structure shown in FIG. 13 is implemented by providing a fixed resistance 30 instead of the nMOS transistor 25 in the circuit of FIG. 7. In this circuit structure shown in FIG. 13, the pnp bipolar transistor 29 is released from the diode connection, and the base potential thereof becomes equal to the potential of the output terminal 17 through the resistance 30 finally, so that the potential level of the logic "0" at the output terminal 17 can be lowered to the level of the second reference potential $V_{EE}$.

Figure 14:
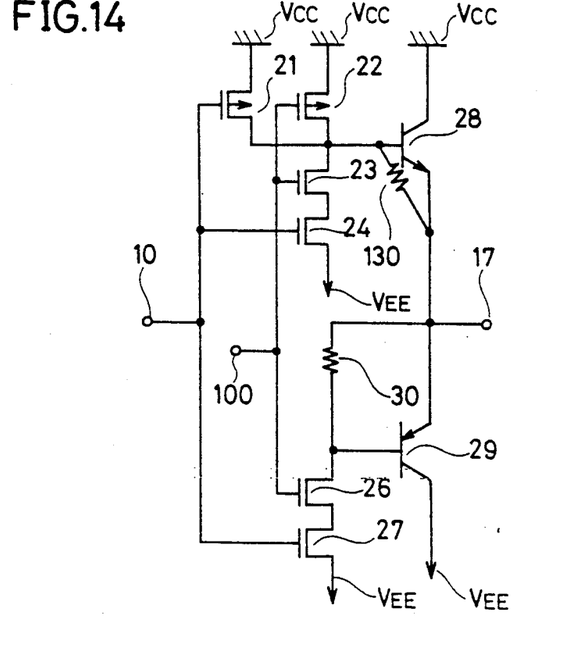
FIG. 14 shows a structure of a semiconductor logic circuit in accordance with a seventh embodiment of the present invention.

FIG. 14 shows a seventh embodiment of the present invention which is a modification of the circuit structure shown in FIG. 13. In the circuit structure shown in FIG. 14, a fixed resistance 130 is provided between the base and the emitter of the npn bipolar transistor 28 of the circuit shown in FIG. 13. In the circuit structure of FIG. 14, the base and the emitter of the npn bipolar transistor 28 are connected through the fixed resistance 130, the potential at the output terminal 17 can be fed back to the base thereof, and therefore the emitter potential of the npn bipolar transistor 28 can be increased to the level of the first reference potential Vcc. Consequently, the potential level of the signal "1" at the output terminal 17 can be increased to the level of Vcc. As in the structure of FIG. 13, the potential level of the logic "0" at the output terminal 17 can be lowered to the level of the second reference potential $V_{EE}$.

Figure 15:
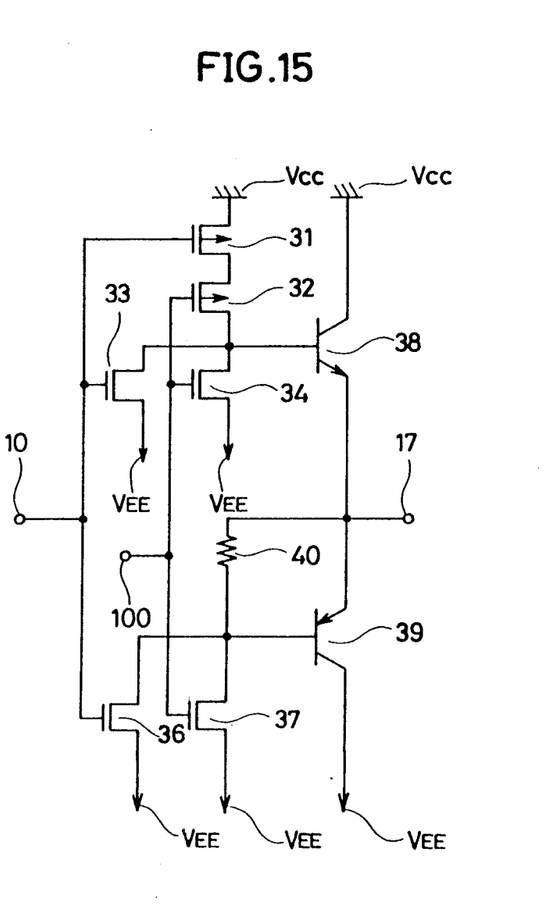
FIG. 15 shows a structure of a semiconductor logic circuit in accordance with an eighth embodiment of the present invention.

FIG. 15 shows an eighth embodiment of the present invention, which is a modification of the circuit structure shown in FIG. 9. The circuit structure can be provided by replacing the nMOS transistor 35 with a fixed resistance 40 in the circuit structure of FIG. 9. In this case also, the base and the emitter of the pnp bipolar transistor 39 are connected through the fixed resistance 40, and therefore the potential level of the logic "0" at the output terminal 17 can be lowered to the level of the second reference potential $V_{EE}$.

Figure 16:
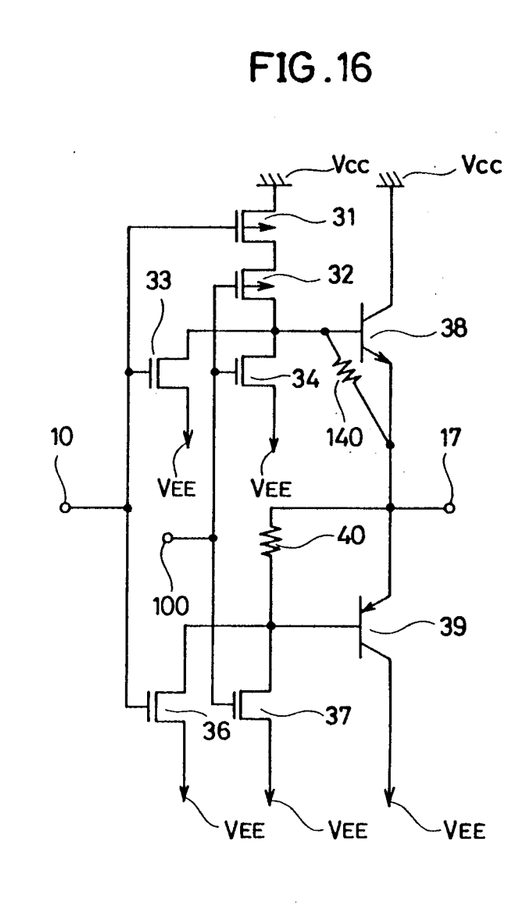
FIG. 16 shows a structure of semiconductor logic circuit in accordance with a ninth embodiment of the present invention.

FIG. 16 shows a structure of a logic circuit in accordance with a ninth embodiment of the present invention. The circuit shown in FIG. 16 is a modification of the circuit shown in FIG. 15, which is realized by providing a fixed resistance 140 between the base and the emitter of the npn bipolar transistor 38 in the circuit structure of FIG. 15. In this case, in addition to the improvement of the potential level of the logic "0", the potential level of the logic "1" can be increased to the level of the first reference potential Vcc, by connecting the base and the emitter of the npn bipolar transistor 38 through the fixed resistance 140.

Although logic circuits having two inputs are shown in FIGS. 13 to 16, the same can be applied to logic circuit having multiple inputs.

The logic circuit of the present invention can be applied to the multiple input logic circuits other than the NAND circuit, NOR circuit and the NOT circuit.

As described above, in accordance with the present invention, control of the base potential of the bipolar transistor for pulling up the output is carried by CMOS transistors, the base potential thereof is controlled by a MOS transistor operating in response to an input signal and having a conductivity type opposite to that of a pull down bipolar transistor, and impedance means is provided between the base and emitter of the pull down bipolar transistor, whereby the pull down and pull up bipolar transistors can be turned on-off at high speed, the bipolar transistors can be prevented from being on simultaneously, and therefore a semiconductor logic circuit which operates at high speed and consumes less power can be provided.

Since the current driving capability of the MOS transistor driving the base potential of the pull down bipolar transistor can be adjusted by changing the transistor size (for example, gate width), the rising characteristic of the pull down bipolar transistor can be adjusted, the rising and falling characteristics of the output pull up and pull down bipolar transistors can be made equal to each other without changing the input logical threshold value, and therefore a logic circuit having the same rising and falling characteristics can be provided. In addition, both the pull up and pull down bipolar transistors are used with their collector grounded, the collector regions of the pull up and pull down bipolar transistors can be also used as the substrate regions of the MOS transistors, which significantly reduces the area of layout, and therefore a logic circuit having smaller area of occupation can be provided.

By using a MOS transistor which operates as a switch in response to the base potential of the pull up bipolar transistor as the impedance means between the base and emitter of the pull down bipolar transistor, the pull down bipolar transistor can be changed to the off state at high speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor logic circuit carrying out a prescribed logical arithmetic operation on a signal inputted to an input terminal (10, 100) to output a resultant signal at an output terminal (17), comprising:

a first bipolar transistor (15; 28; 38) having a collector of a first conductivity type connected to a first reference potential, an emitter of said first conductivity type connected to said output terminal, and a base of a second conductivity type;

a second bipolar transistor (16; 29; 39) having an emitter of said second conductivity type connected to said output terminal, a collector of said second conductivity type connected to a second reference potential, and a base of said first conductivity type;

at least one first insulated gate type field effect transistor (11; 21, 22; 31, 32) of the second conductivity type provided between said base of said first bipolar transistor and said first reference potential for selectively coupling said base of said first bipolar transistor and said first reference potential in response to the signal applied to said input terminal;

at least one second insulated gate type field effect transistor (12; 23, 24; 33, 34) provided between said base of said first bipolar transistor and said second reference potential for selectively coupling said base of said first bipolar transistor and said second reference potential in response to said signal applied to said input terminal;

at least one third insulated gate field effect transistor (14; 26, 27; 36, 37) provided between said base of said second bipolar transistor and said second reference potential, for selectively coupling said base of said second bipolar transistor and said second reference potential in response to said signal applied to said input terminal; and impedance means (13; 25; 35; 18; 30; 40) for coupling said base of said second bipolar transistor and said output terminal.

2. A semiconductor logic circuit according to claim 1, wherein
said impedance means comprises an insulated gate field effect transistor (13; 25; 35) of the first conductivity type which is turned on in response to a potential of said base of said first bipolar transistor for connecting said base of said second bipolar transistor and said output terminal.

3. A semiconductor logic circuit according to claim 1, wherein
said impedance means comprises resistance element means (18; 30; 40) for connecting said base of said second bipolar transistor and said output terminal.

4. A semiconductor logic circuit according to claim 1, wherein
said at least one said first insulated gate type field effect transistor (21, 22) are connected in parallel, and said at least one said second insulated gate type field effect transistor (23, 24) are connected in series, when they comprise a plurality of field effect transistors.

5. A semiconductor logic circuit according to claim 1, wherein
said at least one said first insulated gate type field effect transistor (31, 32) are connected in series, and said at least one said second insulated gate type field effect transistor (33, 34) are connected in parallel, when they comprise a plurality of field effect transistors.

6. A semiconductor logic circuit according to claim 1, further comprising
resistance means (19; 130; 140) connected between said base and said emitter of said first bipolar transistor.

* * * * *

UNITED STATES PATENT AND TRADEMARK OFFICE
CERTIFICATE OF CORRECTION

PATENT NO. : 5,013,936

DATED : May 7, 1991

INVENTOR(S) : Toru SHIOMI et al.

It is certified that error appears in the above-identified patent and that said Letters Patent is hereby corrected as shown below:

On the Title page:

In the Abstract, line 11, change "collector" to --emitter--.

Signed and Sealed this

Twenty-seventh Day of April, 1993

Attest:

MICHAEL K. KIRK

*Attesting Officer*    *Acting Commissioner of Patents and Trademarks*